United States Patent
Nomachi (10) Patent No.: US 9,190,607 B2
(45) Date of Patent: Nov. 17, 2015

(54) MAGNETORESISTIVE ELEMENT AND METHOD OF MANUFACTURING THE SAME

(71) Applicant: Kabushiki Kaisha Toshiba, Tokyo (JP)

(72) Inventor: Akiko Nomachi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 9 days.

(21) Appl. No.: 14/177,559

(22) Filed: Feb. 11, 2014

(65) Prior Publication Data

US 2014/0159176 A1    Jun. 12, 2014

Related U.S. Application Data

(62) Division of application No. 13/604,457, filed on Sep. 5, 2012, now Pat. No. 8,691,596.

(30) Foreign Application Priority Data

Jan. 5, 2012    (JP) .................................. 2012-000671

(51) Int. Cl.

| H01L 21/302 | (2006.01) |
|---|---|
| H01L 43/12 | (2006.01) |
| H01L 43/02 | (2006.01) |
| H01L 41/47 | (2013.01) |
| H01L 41/297 | (2013.01) |
| H01L 27/22 | (2006.01) |
| H01L 41/22 | (2013.01) |
| H01L 41/12 | (2006.01) |
| H01L 41/06 | (2006.01) |
| H01L 41/332 | (2013.01) |
| H01L 41/20 | (2006.01) |
| H01L 41/27 | (2013.01) |

(Continued)

(52) U.S. Cl.
CPC ................ *H01L 43/12* (2013.01); *H01L 27/20* (2013.01); *H01L 27/222* (2013.01); *H01L 41/06* (2013.01); *H01L 41/12* (2013.01); *H01L 41/20* (2013.01); *H01L 41/22* (2013.01); *H01L 41/27* (2013.01); *H01L 41/297* (2013.01); *H01L 41/332* (2013.01); *H01L 41/47* (2013.01); *H01L 43/02* (2013.01); *H01L 43/08* (2013.01); *H01L 27/228* (2013.01)

(58) Field of Classification Search
None
See application file for complete search history.

(56) References Cited

U.S. PATENT DOCUMENTS

| 7,663,131 B2 | 2/2010 | Horng et al. | |
|---|---|---|---|
| 2004/0188732 A1* | 9/2004 | Fukuzumi | 257/295 |

(Continued)

FOREIGN PATENT DOCUMENTS

| JP | 2007-158361 | 6/2007 |
|---|---|---|
| JP | 2009-176806 | 8/2009 |

*Primary Examiner* — Fei Fei Yeung Lopez
(74) *Attorney, Agent, or Firm* — Finnegan, Henderson, Farabow, Garrett & Dunner, LLP (57) ABSTRACT

According to one embodiment, a magnetoresistive element manufacturing method is provided. In this magnetoresistive element manufacturing method, a first ferromagnetic layer, tunnel barrier layer, and second ferromagnetic layer are sequentially formed on a substrate. A conductive hard mask is formed on the second ferromagnetic layer. The hard mask is patterned. A hard layer is formed on the side surface of the hard mask. The second ferromagnetic layer, tunnel barrier layer, and first ferromagnetic layer are processed by IBE in an oblique direction by using the hard mask and hard layer as masks. The IBE etching rate of the hard layer is lower than that of the hard mask.

9 Claims, 6 Drawing Sheets

(51) Int. Cl.
*H01L 27/20* (2006.01)
*H01L 43/08* (2006.01)

(56) References Cited

U.S. PATENT DOCUMENTS

2006/0261425 A1* 11/2006 Suemitsu et al. ............. 257/421
2007/0072132 A1 3/2007 Kamijima et al.
2008/0217710 A1 9/2008 Horng et al.
2009/0108383 A1 4/2009 Horng et al.
2010/0020592 A1* 1/2010 Hosotani et al. .............. 365/158
2010/0200900 A1 8/2010 Iwayama
2011/0198314 A1 8/2011 Wang et al.
2012/0146166 A1* 6/2012 Levi et al. ..................... 257/421

* cited by examiner

MAGNETORESISTIVE ELEMENT AND METHOD OF MANUFACTURING THE SAME

CROSS-REFERENCE TO RELATED APPLICATIONS

This application is a division of application Ser. No. 13/604,457, filed Sep. 5, 2012, which is based upon and claims the benefit of priority from prior Japanese Patent Application No. 2012-000671, filed Jan. 5, 2012, the entire contents of both of which are incorporated herein by reference.

FIELD

Embodiments described herein relate generally to a magnetoresistive element and a method of manufacturing the same.

BACKGROUND

A spin transfer torque magnetic random access memory (MRAM) including a magnetoresistive element containing a ferromagnetic material as a memory element has been proposed. This MRAM is a memory that stores information by controlling the electrical resistance of the magnetoresistive element to two states, i.e., a high-resistance state and low-resistance state by changing the magnetization direction in a magnetic layer by an electric current to be injected into the magnetoresistive element.

DETAILED DESCRIPTION

In general, according to one embodiment, a magnetoresistive element manufacturing method is provided. In this magnetoresistive element manufacturing method, a first ferromagnetic layer, tunnel barrier layer, and second ferromagnetic layer are sequentially formed on a substrate. A conductive hard mask is formed on the second ferromagnetic layer. The hard mask is patterned. A hard layer is formed on the side surface of the hard mask. The second ferromagnetic layer, tunnel barrier layer, and first ferromagnetic layer are processed by ISE in an oblique direction by using the hard mask and hard layer as masks. The IBE etching rate of the hard layer is lower than that of the hard mask.

A magnetoresistive element such as a magnetic tunnel junction (MTJ) element using the tunneling magnetoresistive (TMR) effect has a pillar structure including a reference layer and storage layer stacked with a tunnel barrier layer being sandwiched between them. Each layer forming this magnetoresistive element contains a hard metal material. This makes it difficult to process the magnetoresistive element into the pillar structure by reactive ion etching (RIE) or the like. Consequently, plasma damage occurs, and the characteristics deteriorate. When processing the magnetoresistive element, therefore, physical etching such as ion beam etching (IBE) using argon (Ar) is performed. In this IBE processing, a hard mask used as a mask is removed (etched) by an amount corresponding to the etching amount of the magnetoresistive element and the etching selectivity (etching rate) to the magnetoresistive element.

In the IBE processing, the etched metal material adheres as a so-called re-deposition product on the circumferential (side) surface of the pillar structure. This forms a leakage path over the reference layer and storage layer. To prevent the formation of this re-deposition product, it is necessary to make an ion beam of IBE incident in a direction (oblique direction) inclined to the perpendicular direction (normal) of the substrate surface, and perform etching while removing the re-deposition product on the circumferential surface of the pillar structure.

In this case, the above-described removal of the hard mask progresses not only in the vertical direction but also in the oblique direction. That is, not only the upper surface of the hard mask is etched in the vertical direction, but also the shoulders (corners) of the hard mask are etched in the oblique direction. The influence of this oblique etching becomes significant as the micropatterning of the MTJ advances. Especially when the diameter of the pillar structure of a magnetoresistive element to be processed becomes smaller than its height (film thickness), most of the removal amount of the hard mask is the amount of oblique etching. Consequently, the hard mask is shaped into a cone whose diameter decreases from the lower portion toward the upper portion, and does not function as a mask any more. Accordingly, no pillar structure having a desired shape can be obtained.

To solve the above problem, it is possible to make the film thickness of the hard mask much larger than that of the magnetoresistive element. If the film thickness of the hard mask is increased, however, the processing (patterning) of the hard mask itself becomes difficult, and this produces dimensional variations of the hard mask and magnetoresistive element. The dimensional variations exert a very large influence on the characteristics of the magnetoresistive element. Also, if the film thickness of the hard mask is increased, the hard mask becomes an obstacle to an obliquely entering ion beam. Since this makes it necessary to increase the distance between adjacent magnetoresistive elements, it is difficult to increase the density of elements.

Another method is to use, as the hard mask material, a hard material (a material having a high Vickers hardness) having an IBE etching rate much lower than that of the magnetoresistive element. Examples of the hard material are insulating materials such as diamond-like carbon (DLC), microcrystalline alumina ($Al_2O_3$), boron nitride (BN), and silicon carbide (SiC). However, the hard mask must be a metal material in order to electrically connect the magnetoresistive element and an upper electrode after the magnetoresistive element is processed. Accordingly, none of the above-mentioned hard materials can be used as the hard mask.

A metal such as titanium nitride (TiN), tantalum (Ta), or tungsten (W) cannot sufficiently increase the etching rate to the magnetoresistive element. As described above, therefore, the film thickness must be increased even when using any of these metal materials as the hard mask. This produces dimensional variations and characteristic deterioration of the magnetoresistive element, and makes the density of elements difficult to increase.

By contrast, this embodiment solves the above problems by using a metal material as the hard mask in the IBE processing of the magnetoresistive element, and making the etching rate of the hard mask lower than that of the magnetoresistive element.

This embodiment will be explained below with reference to the accompanying drawing. In the drawing, the same reference numerals denote the same parts. Also, a repetitive explanation will be made as needed.

<MRAM Configuration Example>

A configuration example of an MRAM will be explained with reference to FIGS. 1 and 2.

Figure 1:
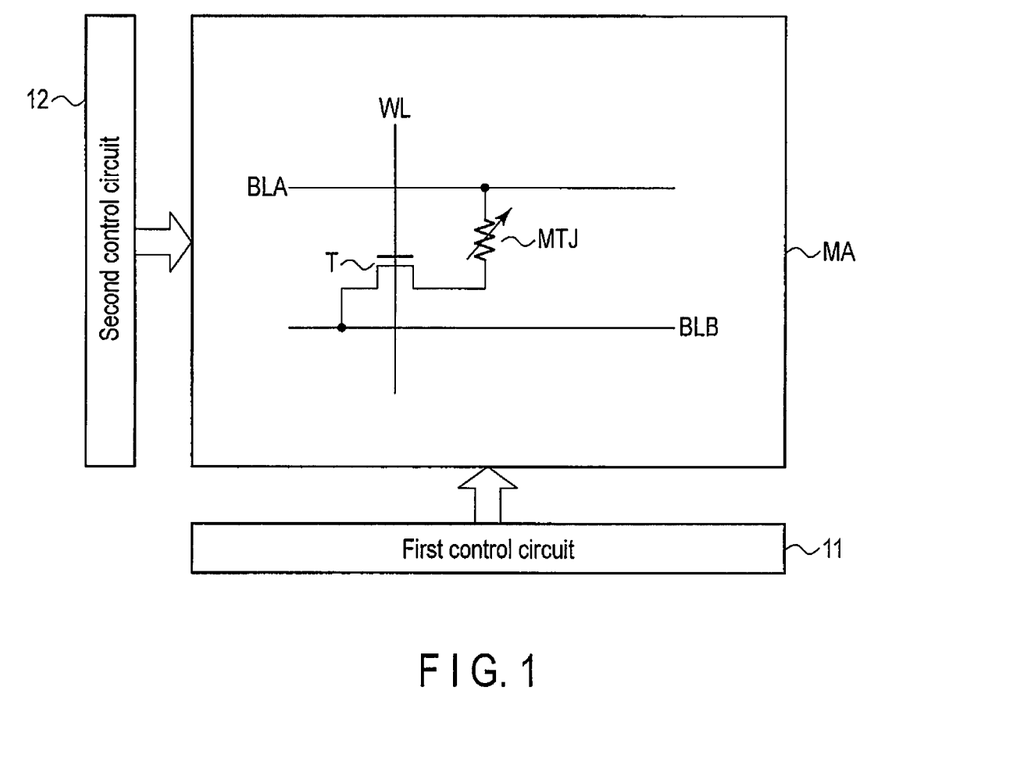
FIG. 1 is a circuit diagram showing a memory cell of an MRAM.

FIG. 1 is a circuit diagram showing a memory cell of the MRAM.

As shown in FIG. 1, a memory cell in a memory cell array MA includes a series-connected circuit of a magnetoresistive element MTJ and a switching element (for example, an FET) T. One terminal of the series-connected circuit (one terminal of the magnetoresistive element MTJ) is connected to a bit line BLA, and the other terminal of the series-connected circuit (one terminal of the switching element T) is connected to a bit line BLB. The control terminal of the switching element T, for example, the gate electrode of the FET is connected to a word line WL.

A first control circuit 11 controls the potential of the word line WL. A second control circuit 12 controls the potential of the bit lines BLA and BLB.

Figure 2:
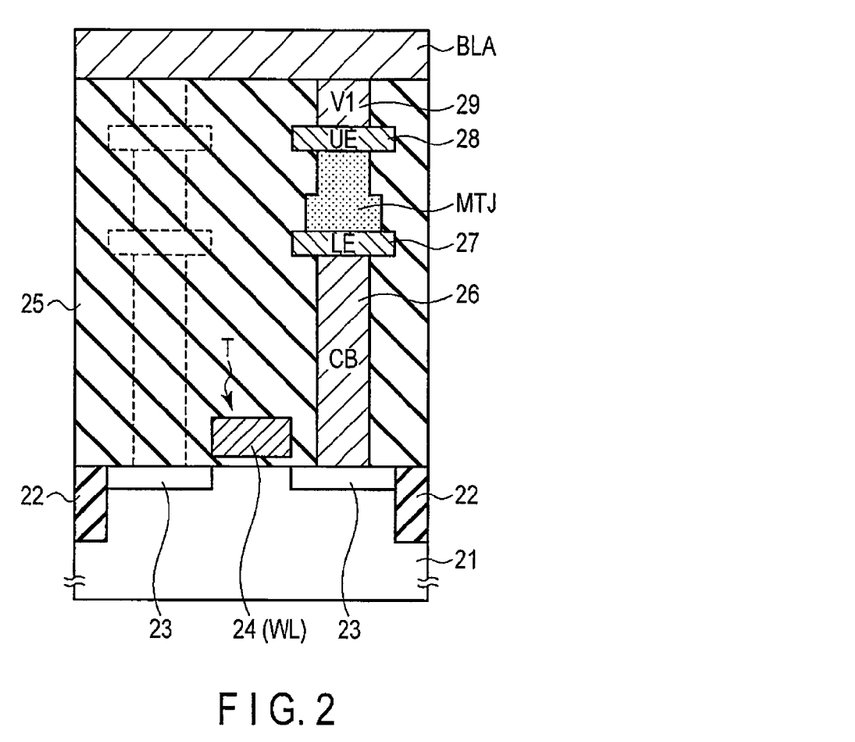
FIG. 2 is a sectional view showing the structure of the memory cell of the MRAM.

FIG. 2 is a sectional view showing the structure of the memory cell of the MRAM.

As shown in FIG. 2, the memory cell includes the switching element T and magnetoresistive element MTJ arranged on a semiconductor substrate 21.

The semiconductor substrate 21 is, for example, a silicon substrate, and its conductivity type can be either a p- or n-type. A silicon oxide ($SiO_2$) layer having an STI structure is formed as an element isolation insulating layer 22 in the semiconductor substrate 21.

The switching element T is formed in the surface region of the semiconductor substrate 21, i.e., in an element region (active area) surrounded by the element isolation insulating layer 22. In this example, the switching element T is an FET, and includes two source/drain diffusion regions 23 in the semiconductor substrate 21, and a gate electrode 24 formed on a channel region between them. The gate electrode 24 functions as the word line WL.

The switching element T is covered with an interlayer dielectric layer (for example, $SiO_2$) 25. A contact hole is formed in the interlayer dielectric layer 25, and a contact via (CB) 26 is formed in this contact hole. The contact via 26 is made of a metal material such as W or copper (Cu).

The lower surface of the contact via 26 is connected to the switching element. In this example, the contact via 26 is in direct contact with the source/drain diffusion layer 23.

A lower electrode (LE) 27 is formed on the contact via 26. The lower electrode 27 has, for example, a multilayered structure including Ta (10 nm)/ruthenium (Ru) (5 nm)/Ta (5 nm).

The magnetoresistive element MTJ is formed on the lower electrode 27, i.e., immediately above the contact via 26. Details of the magnetoresistive element MTJ according to this embodiment will be described later.

An upper electrode (UE) 28 is formed on the magnetoresistive element MTJ. The upper electrode 28 is made of, for example, TiN. The upper electrode 28 is connected to the bit line (for example, Cu) BLA through a via (for example, Cu) 29.

First Embodiment

A magnetoresistive element MTJ according to the first embodiment will be explained below with reference to FIGS. 3, 4, 5, 6, and 7. The first embodiment is an example in which in the processing steps of the magnetoresistive element MTJ, a hard layer 34 is formed on the circumferential (side) surface of a hard mask 33 made of a metal material, and the magnetoresistive element MTJ is processed by physical etching using these hard mask and hard layer as masks. This makes it possible to reduce the dimensional variations of the hard mask 33 and magnetoresistive element MTJ. The magnetoresistive element MTJ according to the first embodiment will be explained in detail below.

Structure of First Embodiment

First, the structure of the magnetoresistive element MTJ according to the first embodiment will be explained below with reference to FIG. 3.

Figure 3:
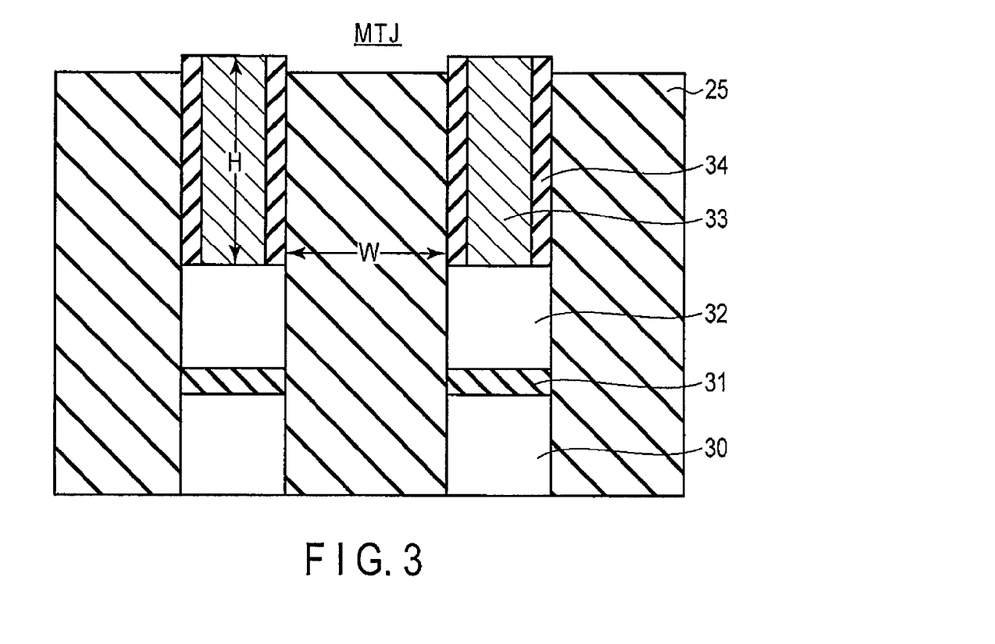
FIG. 3 is a sectional view showing the structure of a magnetoresistive element according to the first embodiment.

FIG. 3 is a sectional view showing the structure of the magnetoresistive element MTJ according to the first embodiment. FIG. 3 shows the structure of two adjacent magnetoresistive elements MTJ.

As shown in FIG. 3, the magnetoresistive element MTJ includes a storage layer 30, tunnel barrier layer 31, and reference layer 32.

The storage layer 30 is formed on an underlayer (not shown) on a lower electrode 27. The storage layer 30 is a ferromagnetic layer in which the magnetization direction is variable, and has perpendicular magnetization that is perpendicular to or almost perpendicular to the film surfaces (upper surface/lower surface). "The magnetization direction is variable" herein mentioned means that the magnetization direction changes with respect to a predetermined write current. Also, "almost perpendicular" means that the direction of residual magnetization falls within the range of $45° < \theta \leq 90°$.

The storage layer 30 is made of a ferromagnetic material containing one or more elements selected from, for example, cobalt (Co) and iron (Fe). It is also possible to add an element such as boron (B), carbon (C), or silicon (Si) to the ferromagnetic material, in order to adjust saturation magnetization, magnetocrystalline anisotropy, or the like.

The tunnel barrier layer 31 is formed on the storage layer 30. The tunnel barrier layer 31 is a nonmagnetic layer and made of, for example, magnesium oxide (MgO).

The reference layer 32 is formed on the tunnel barrier layer 31. The reference layer 32 is a ferromagnetic layer in which the magnetization direction is invariable, and has perpendicular magnetization that is perpendicular to or almost perpendicular to the film surfaces. "The magnetization direction is invariable" herein mentioned means that the magnetization direction remains unchanged with respect to a predetermined write current. That is, a magnetization direction reversal threshold value of the reference layer 32 is larger than that of the storage layer 30.

The reference layer 32 is made of a ferromagnetic material containing one or more elements selected from, for example, Co, Fe, B, nickel (Ni), iridium (Ir), platinum (Pt), manganese (Mn), and Ru.

The film thickness (height) of the magnetoresistive element MTJ including the storage layer 30, tunnel barrier layer 31, and reference layer 32 is, for example, 40 (inclusive) to 50 (inclusive) nm. The planar shape of the magnetoresistive element MTJ is, for example, a circle, and the diameter of the circle is, for example, 30 (inclusive) to 50 (inclusive) nm. Therefore, the magnetoresistive element MTJ is formed into a pillar shape.

Note that although not shown, an interface layer may also be formed in the interface between the reference layer 32 and tunnel barrier layer 31. The interface layer is formed to obtain lattice matching with the tunnel barrier layer 31 in contact with the lower surface of the interface layer. The interface layer is made of, for example, the same material as that of the reference layer 32, but the composition ratio can be different from that of the reference layer 32.

A shift adjusting layer can be formed on a spacer layer (for example, Ru) (not shown) on the reference layer 32. The shift adjusting layer is a magnetic layer in which the magnetization direction is invariable, and has perpendicular magnetization that is perpendicular to or almost perpendicular to the film surfaces. The magnetization direction is opposite to that of the reference layer 32. This enables the shift adjusting layer to cancel a leakage magnetic field from the reference layer 32 to the storage layer 30. In other words, the shift adjusting layer has an effect of adjusting the offset of the reversal characteristic applied on the storage layer 30 by a leakage magnetic field from the reference layer 32 in the opposite direction. This shift adjusting layer is made of, for example, an artificial lattice having a multilayered structure containing a magnetic material such as Ni, Fe, or Co and a nonmagnetic material such as Cu, Pd, or Pt.

The storage layer 30 and reference layer 32 can have a dimensional difference in a plane. For example, the planar diameter of the storage layer 30 can be smaller than that of the reference layer 32. This makes it possible to prevent an electrical shortcircuit between the storage layer 30 and reference layer 32. Note that the planar shape of the magnetoresistive element MTJ is not limited to a circle, and may also be a square, rectangle, or ellipse.

Furthermore, the positions of the storage layer 30 and reference layer 32 can be switched. That is, the reference layer 32, tunnel barrier layer 31, and storage layer 30 can be formed in this order on the lower electrode 27.

In this embodiment, the hard mask 33 and hard layer 34 are formed on the magnetoresistive element MTJ.

More specifically, the hard mask 33 is formed on the reference layer 32. The hard mask 33 is made of a conductive metal material, for example, TiN. The hard mask 33 may also be a film containing Ti, Ta, or W, or a multilayered film containing these materials.

A film thickness (height) H of the hard mask 33 is, for example, 40 (inclusive) to 50 (inclusive) nm. The planar shape of the hard mask 33 is, for example, a circle, and the diameter of the circle is, for example, 20 (inclusive) to 30 (inclusive) nm. Accordingly, the hard mask 33 is formed into a pillar shape.

The hard layer 34 is formed on the circumferential surface of the hard mask 33. In other words, the hard layer 34 is formed to cover the circumference of the pillar hard mask 33. The hard layer 34 is made of, for example, a hard material having an IBE etching rate lower than that of the hard mask 33 (for example, TiN, Ta, or W), in a manufacturing step to be described later. Examples of this hard material are insulating materials such as DLC, microcrystalline $Al_2O_3$, BN, and SiC. Note that the IBE etching rate of the hard layer 34 is desirably one-third or less that of the hard mask 33.

The IBE etching rate is mainly determined by the Vickers hardness of the material. The Vickers hardness of any of the above-mentioned hard materials is 1,000 or more. By contrast, the Vickers hardness of the hard mask 33 is, for example, about a few hundreds. That is, the Vickers hardness of the hard layer 34 is higher than that of the hard mask 33. This can make the IBE etching rate of the hard layer 34 higher than that of the hard mask 33. More specifically, the Vickers hardnesses of DLC, $Al_2O_3$, BN, and SiC are respectively about seven, three, six, and three times that of the hard mask 33 (TiN). Accordingly, the IBE etching rate of any of the above-mentioned hard materials can be one-third or less that of the hard mask 33.

The hard layer 34 may also be made of the same material (element) as that of the hard mask 33, for example, TiN, Ta, or W. When the hard layer 34 is made of the same material as that of the hard mask 33, the IBE etching rate is mainly determined by the density of the material. More specifically, the IBE etching rate decreases as the density increases. Therefore, the hard layer 34 is formed to have a density higher than that of the hard mask 33. Consequently, the IBE etching rate of the hard layer 34 can be made higher than that of the hard mask 33.

The film thickness of the hard layer 34 is, for example, 10 (inclusive) to 20 (inclusive) nm. Accordingly, the total film thickness of the hard mask 33 and hard layer 34 is 30 (inclusive) to 50 (inclusive) nm. As will be described later, the magnetoresistive element MTJ (the reference layer 32, tunnel barrier layer 31, and storage layer 30) is processed by IBE using the hard mask 33 and hard layer 34 as masks. This makes the total film thickness of the hard mask 33 and hard layer 34 equivalent to the film thickness of the magnetoresistive element MTJ, and they overlap each other in a plane.

A distance W between the two adjacent magnetoresistive elements MTJ can be decreased by decreasing the height H of the hard mask 33. More specifically, when the ion beam incident angle (the angle to the perpendicular direction of the film surfaces) is set at 45° in an IBE step (described later), the distance W between the two adjacent magnetoresistive elements MTJ can be set to 40 (inclusive) to 50 (inclusive) nm if the height H of the hard mask 33 is 40 (inclusive) to 50 (inclusive) nm.

An upper electrode 28 is formed on the hard mask 33 and hard layer 34. Since the upper electrode 28 is formed in contact with the hard mask 33 made of a metal material, the upper electrode 28 is electrically connected to the magnetoresistive element MTJ via the hard mask 33.

Next, an operation example of the magnetoresistive element MTJ will be explained.

The magnetoresistive element MTJ is, for example, a spin transfer type magnetoresistive element. Therefore, when writing data or reading data from the magnetoresistive element MTJ, electric currents are bidirectionally supplied to the magnetoresistive element MTJ in a direction perpendicular to the film surfaces (stacked surfaces).

More specifically, data write to the magnetoresistive element MTJ is performed as follows.

When supplying electrons (electrons moving from the reference layer 32 to the storage layer 30) from the upper electrode 28, electrons spin-polarized in the same direction as the magnetization direction in the reference layer 32 are injected into the storage layer 30. In this state, the magnetization direction in the storage layer 30 is matched with that in the reference layer 32. Consequently, the magnetization directions in the reference layer 32 and storage layer 30 are arranged parallel. In this parallel arrangement, the resistance of the magnetoresistive element MTJ is minimum. This state is defined as, for example, binary 0.

On the other hand, when supplying electrons (electrons moving from the storage layer 30 to the reference layer 32) from the lower electrode 27, electrons reflected by the reference layer 32 and spin-polarized in the opposite direction to the magnetization direction in the reference layer 32 are injected into the storage layer 30. In this state, the magnetization direction in the storage layer 30 is matched with the opposite direction to the magnetization direction in the reference layer 32. Consequently, the magnetization directions in the reference layer 32 and storage layer 30 are arranged antiparallel. In this antiparallel arrangement, the resistance of the magnetoresistive element MTJ is maximum. This state is defined as, for example, binary 1.

Data read is performed as follows.

A read current is supplied to the magnetoresistive element MTJ. This read current is set to a magnitude that does not reverse the magnetization direction in the storage layer 30 (to less than the write current). A semiconductor device capable of a memory operation is obtained by detecting the change in resistance of the magnetoresistive element MTJ in this state.

Manufacturing Method of First Embodiment

A method of manufacturing the magnetoresistive element MTJ according to the first embodiment will be explained below with reference to FIGS. 4, 5, 6, and 7.

FIGS. 4, 5, 6, and 7 are sectional views showing the manufacturing steps of the magnetoresistive element MTJ according to the first embodiment. FIGS. 4, 5, 6, and 7 illustrate the steps of manufacturing two adjacent magnetoresistive elements MTJ.

Figure 4:
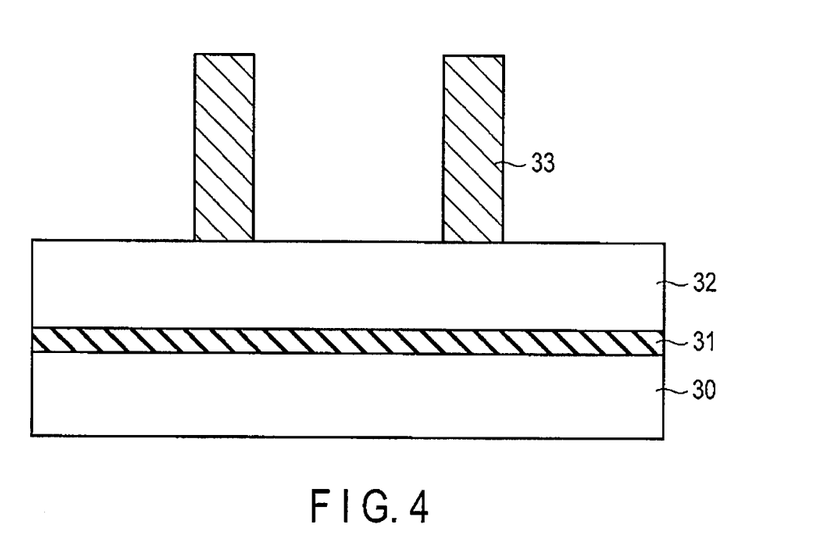
FIGS. 4, 5, 6, and 7 are sectional views showing the manufacturing steps of the magnetoresistive element according to the first embodiment.

First, as shown in FIG. 4, a storage layer 30 is formed on an underlayer (not shown) on a lower electrode 27 by, for example, chemical vapor deposition (CVD). The storage layer 30 is a ferromagnetic layer, and made of a ferromagnetic material containing one or more elements selected from, for example, Co and Fe. An element such as B, C, or Si may also be added to the ferromagnetic material in order to adjust saturation magnetization, magnetocrystalline anisotropy, or the like.

Then, a tunnel barrier layer 31 is formed on the storage layer 30 by, for example, CVD. The tunnel barrier layer 31 is a nonmagnetic layer and made of, for example, MgO.

Subsequently, a reference layer 32 is formed on the tunnel barrier layer 31 by, for example, CVD. The reference layer 32 is a ferromagnetic layer and made of, for example, CoFeB. The reference layer 32 may also be made of a ferromagnetic material containing one or more elements selected from, for example, Co, Fe, B, Ni, Ir, Pt, Mn, and Ru.

A hard mask 33 is formed on the reference layer 32 by, for example, CVD. The hard mask 33 is made of a conductive metal material, for example, TiN. The hard mask 33 may also be a film containing Ti, Ta, or W, or a multilayered film of these materials. The film thickness of the hard mask 33 is, for example, 40 (inclusive) to 50 (inclusive) nm.

After that, the hard mask 33 is patterned by lithography and RIE. Consequently, the planar shape of the hard mask 33 becomes, for example, a circle, and the diameter of the circle is, for example, 20 (inclusive) to 30 (inclusive) nm. Accordingly, the hard mask 33 is formed into a pillar shape.

Figure 5:
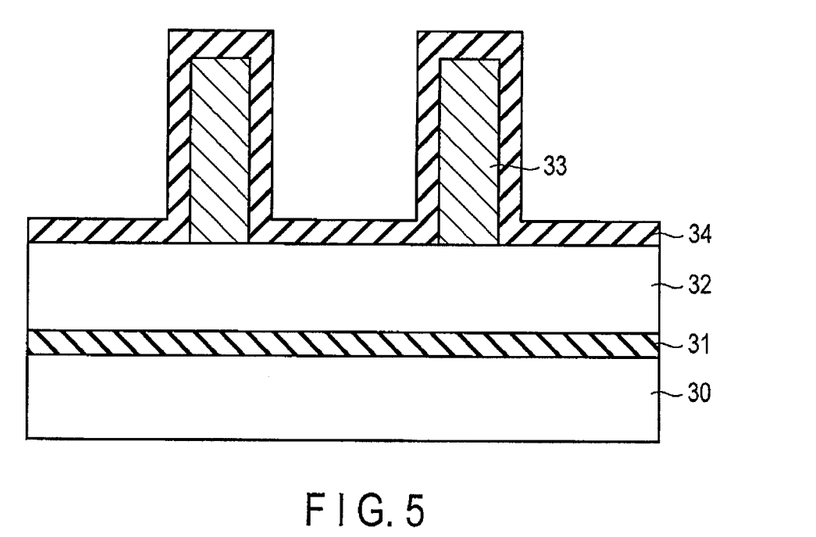

As shown in FIG. 5, a hard layer 34 is formed on the entire surface by, for example, CVD or atomic layer deposition (ALD). More specifically, the hard layer 34 is formed on the upper surface of the reference layer 32, and on the upper surface and circumferential surface of the hard mask 33. The hard layer 34 is made of a hard material having an etching rate of IBE (described later) lower than that of the hard mask 33 (for example, TiN, Ta, or W). That is, the hard layer 34 is made of a hard material having Vickers hardness higher than that of the hard mask 33. Examples of the hard material are insulating materials such as DLC, microcrystalline $Al_2O_3$, BN, and SiC. The film thickness of the hard layer 34 is, for example, 10 (inclusive) to 20 (inclusive) nm.

Figure 6:
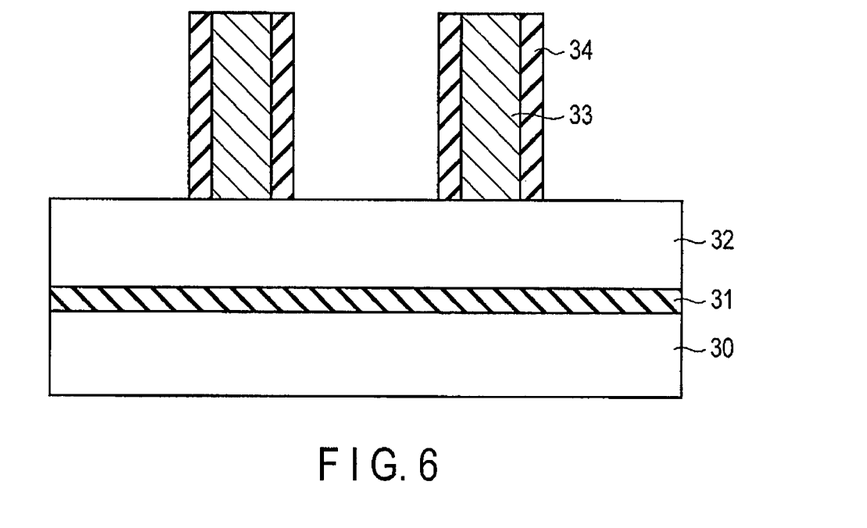

As shown in FIG. 6, the hard layer 34 is etched back by, for example, RIE. The hard layer 34 is removed from the upper surface of the reference layer 32 and the upper surface of the hard mask 33, and remains on only the circumferential surface of the hard mask 33. That is, the hard layer 34 is formed to cover the circumference of the pillar hard mask 33.

In this step, a main gas of RIE is determined accordance with the material of the hard layer 34. For example, an $O_2$-based gas is used as the main gas when the hard layer 34 is DLC, a $BCl_3$-based gas is used when the hard layer 34 is $Al_2O_3$, a $Cl_2$-based gas or HBr-based gas is used when the hard layer 34 is BN, and an $NF_3$-based gas is used when the hard layer 34 is SiC.

The film thickness of the hard layer 34 remaining on the circumferential surface of the hard mask 33 remains almost unchanged, and is, for example, 10 (inclusive) to 20 (inclusive) nm. Therefore, the total film thickness of the hard mask 33 and hard layer 34 is 30 (inclusive) to 50 (inclusive) nm.

Figure 7:
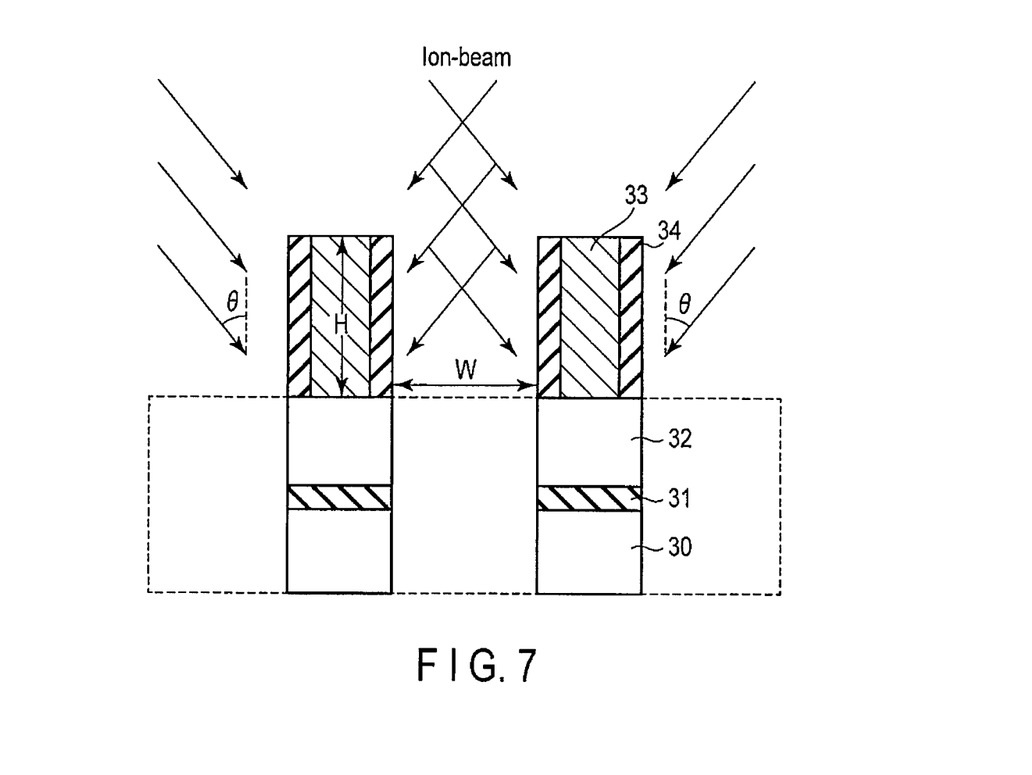

As shown in FIG. 7, the reference layer 32, tunnel barrier layer 31, and storage layer 30 are processed by physical etching such as IBE using the hard mask 33 and hard layer 34 as masks. Consequently, the reference layer 32, tunnel barrier layer 31, and storage layer 30 are patterned like the hard mask 33 and hard layer 34, i.e., patterned into a circular planar shape. The diameter of the reference layer 32, tunnel barrier layer 31, and storage layer 30 is 30 (inclusive) to 50 (inclusive) nm.

In this step, an ion beam of IBE enters in a direction (oblique direction) inclined to the perpendicular direction of the film surfaces. Accordingly, even when the metal materials contained in the etched reference layer 32, tunnel barrier layer 31, and storage layer 30 adhere as re-deposition products on the circumferential surfaces of the reference layer 32, tunnel barrier layer 31, and storage layer 30, etching can be performed while removing the re-deposition products. "An oblique direction" herein mentioned means a direction inclined through θ (0°<θ<90°) to the perpendicular direction of the film surfaces, and θ is, for example, 45°.

When the ion beam is incident in the oblique direction as described above, the etching of the hard mask 33 by IBE mainly progresses in the oblique direction (from the circumferential surface) as micropatterning advances.

In this embodiment, the hard layer 34 having a low IBE etching rate is formed on the circumferential surface of the hard mask 33. The hard layer 34 protects the circumferential surface of the hard mask 33 against IBE. Accordingly, while the reference layer 32, tunnel barrier layer 31, and storage layer 30 are processed by IBE, the hard mask 33 and hard layer 34 are not etched from their circumferential surfaces. Also, the etching amount from the upper surface of the hard mask 33 is extremely small. That is, the film thickness of the hard mask 33 after IBE processing is held almost equal to that before IBE processing. When forming the hard mask 33, therefore, its film thickness need only have a minimum necessary value with which the hard mask 33 functions as a mask.

When the ion beam is incident at θ=45° in IBE, the distance W between the two adjacent magnetoresistive elements MTJ can be made as small as the height H of the hard mask 33. That is, the distance W between the two adjacent magnetoresistive elements MTJ can be decreased to 40 (inclusive) to 50 (inclusive) nm by setting the height H of the hard mask 33 to 40 (inclusive) to 50 (inclusive) nm.

Then, as shown in FIG. 3, an interlayer dielectric layer 25 made of $SiO_2$ is formed on the entire surface by, for example, CVD. Consequently, the interlayer dielectric layer 25 is buried between the adjacent magnetoresistive elements MTJ. After that, the interlayer dielectric layer 25 formed on the hard mask 33 is planarized and etched back, thereby exposing the upper surface of the hard mask 33. An upper electrode 28 made of, for example, TiN is formed on the exposed hard mask 33, and electrically connected to the magnetoresistive element MTJ.

Thus, the magnetoresistive element MTJ according to this embodiment is formed.

Effects of First Embodiment

In the above-mentioned first embodiment, when processing the magnetoresistive element MTJ by IBE, the hard layer 34 having an IBE etching rate lower than that of the hard mask 33 made of a metal material is formed on the circumferential surface of the hard mask 33. Since the hard layer 34 protects the hard mask 33, the etching amount of the hard mask 33 by IBE can be reduced. That is, the film thickness H of the hard mask 33 can be minimized within the range over which the hard mask 33 can function as a mask. As a consequence, it is possible to reduce the dimensional variations of the hard mask 33 and hence the dimensional variations of the magnetoresistive element MTJ.

In addition, it is possible to minimize an obstacle to the ion beam incident in the oblique direction in IBE by minimizing the film thickness H of the hard mask 33. Accordingly, adjacent magnetoresistive elements MTJ can be processed by IBE even when the distance W between them is decreased. That is, the density of the magnetoresistive elements MTJ can be increased.

Second Embodiment

A magnetoresistive element MTJ according to the second embodiment will be explained below with reference to FIGS. 8, 9, 10, and 11. In the first embodiment, after the hard mask 33 made of a metal material is patterned, the hard layer 34 is formed on the circumferential surface of the hard mask 33, and the hard mask 33 and hard layer 34 are used as masks in IBE processing. In the second embodiment, however, a hole 42 is formed in a sacrificial layer 40, and a hard layer 34 and hard mask 33 are formed in this order on the inner surface (circumferential surface) of the hole 42. That is, the second embodiment is an example in which the hard mask 33 and hard layer 34 are formed by a so-called damascene method. The magnetoresistive element MTJ according to the second embodiment will be explained in detail below.

Note that in the second embodiment, the same features as those of the above-mentioned first embodiment will be omitted, and different features will be explained.

Manufacturing Method of Second Embodiment

A method of manufacturing the magnetoresistive element MTJ according to the second embodiment will be explained below with reference to FIGS. 8, 9, 10, and 11.

FIGS. 8, 9, 10, and 11 are sectional views showing the manufacturing steps of the magnetoresistive element MTJ according to the second embodiment. FIGS. 8, 9, 10, and 11 illustrate the steps of manufacturing two adjacent magnetoresistive elements MTJ.

Figure 8:
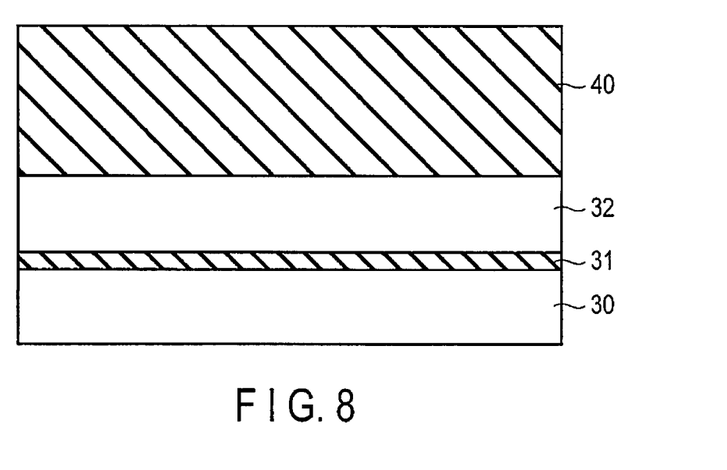
FIGS. 8, 9, 10, and 11 are sectional views showing the manufacturing steps of a magnetoresistive element according to the second embodiment.

First, as shown in FIG. 8, a storage layer 30 as a ferromagnetic layer is formed on an underlayer (not shown) on a lower electrode 27 by, for example, CVD. A tunnel barrier layer 31 as a nonmagnetic layer is formed on the storage layer 30 by, for example, CVD. A reference layer 32 as a ferromagnetic layer is formed on the tunnel barrier layer 31 by, for example, CVD.

Then, a sacrificial layer 40 is formed on the reference layer 32 by, for example, CVD. The sacrificial layer 40 is made of, for example, $SiO_2$, but is not limited to this material. The sacrificial layer 40 need only be made of a material which can be processed by IBE or the like more easily than a hard mask 33, and by which etching selectivity between a hard mask 33 and hard layer 34 is obtained in a step (described later) of removing the sacrificial layer 40. The film thickness of the sacrificial layer 40 is equivalent to that of a hard mask 33 to be formed later, for example, 40 (inclusive) to 50 (inclusive) nm.

Figure 9:
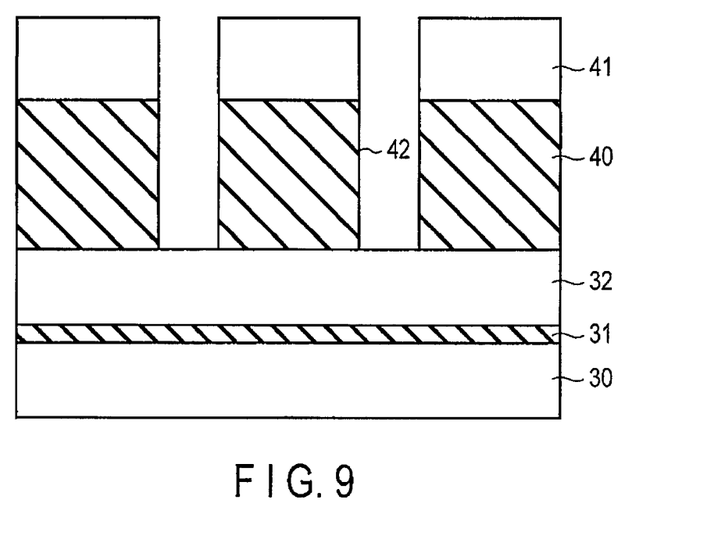

Subsequently, as shown in FIG. 9, a resist 41 is formed on the sacrificial layer 40. After that, the resist 41 is patterned by lithography. A hole 42 is formed in the sacrificial layer 40 by RIE using the patterned resist 41 as a mask. The hole 42 is formed to extend through the sacrificial layer 40, and the reference layer 32 is exposed to the bottom surface of the hole 42. The hole 42 has, for example, a circular planar shape, and has a diameter of, for example, 30 (inclusive) to 50 (inclusive) nm. The diameter of the hole 42 is the total diameter of a hard mask 33 and hard layer 34 to be formed later, and the diameter of the magnetoresistive element MTJ.

Figure 10:
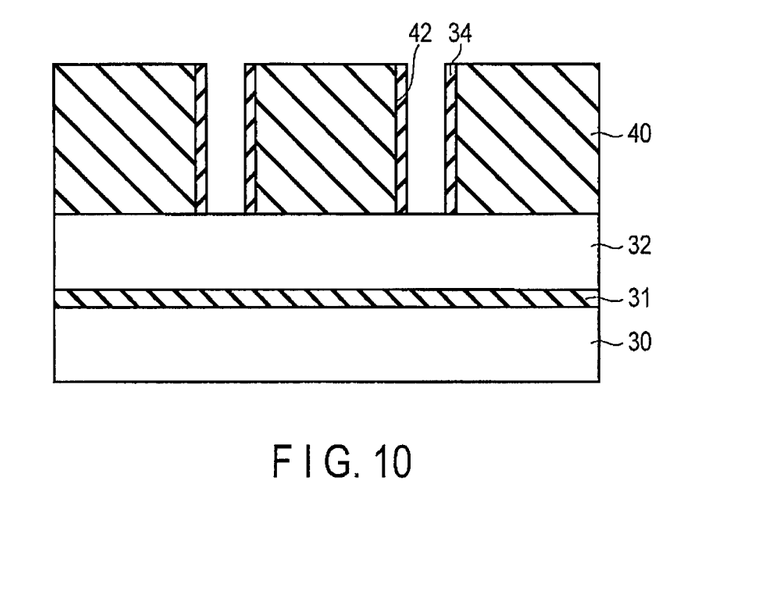

As shown in FIG. 10, the resist 41 is removed, and a hard layer 34 is formed on the entire surface by, for example, CVD or ALD. More specifically, the hard layer 34 is formed on the inner surface of the hole 42 (on [the upper surface of] the reference layer 32 and on [the circumferential surface of] the sacrificial layer 40 in the hole 42), and on (the upper surface of) the sacrificial surface 40 outside the hole 42. The film thickness of the hard layer 34 is, for example, 10 (inclusive) to 20 (inclusive) nm.

After that, the hard layer 34 is etched back by, for example, RIE. Consequently, the hard layer 34 is removed from the upper surface of the reference layer 32 and the upper surface of the sacrificial layer 40, and remains on only the circumferential surface of the sacrificial layer 40.

Figure 11:
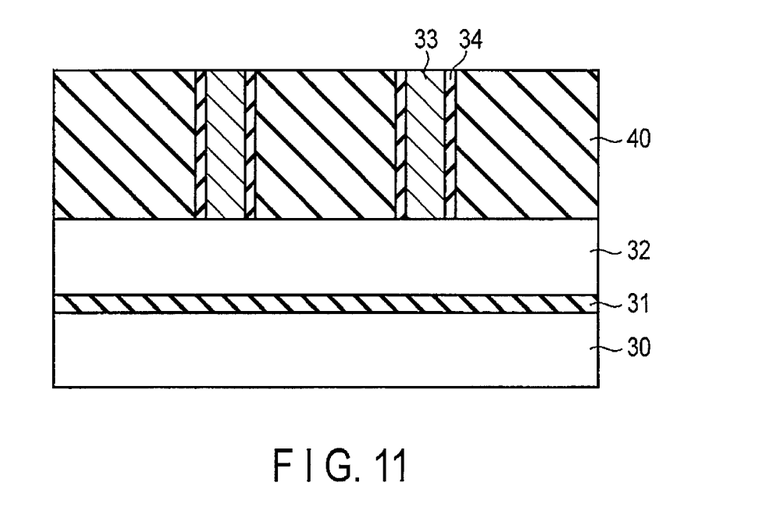

Then, as shown in FIG. 11, a hard mask 33 is formed on the entire surface by, for example, CVD. More specifically, the hard mask 33 is formed on (the circumferential surface of) the hard layer 34 in the hole 42 so as to fill the hole 42, and on (the upper surface of) the sacrificial layer 40 outside the hole 42. After that, the hard mask 33 on the upper surface of the sacrificial layer 40 outside the hole 42 is planarized and removed by, for example, chemical mechanical polishing (CMP). Thus, the hard mask 33 is buried in only the hole 42. That is, the pillar hard mask 33 and the hard layer 34 covering the circumference of the hard mask 33 are formed in the hole 42.

After the sacrificial layer 40 is removed by, for example, RIE, as shown in FIG. 7, the reference layer 32, tunnel barrier layer 31, and storage layer 30 are processed by physical etching such as IBE using the hard mask 33 and hard layer 34 as masks.

Note that the sacrificial layer 40 may also be removed by IBE for processing the reference layer 32, tunnel barrier layer 31, and storage layer 30.

Steps after that will be omitted because they are the same as those in the first embodiment. In this manner, the magnetoresistive element MTJ according to the second embodiment is formed.

Effects of Second Embodiment

The above-mentioned second embodiment can achieve the same effects as those of the first embodiment.

In addition, in the second embodiment, the hole 42 is formed in the sacrificial layer 40 made of, for example, $SiO_2$, the hard layer 34 is formed on the inner surface of the hole 42, and the hard mask 33 is buried. That is, the pillar hard mask 33 and the hard layer 34 around the hard mask 33 are formed without patterning the hard mask 33. Since the sacrificial layer 40 can be processed by RIE more easily than the hard mask 33, the hole 42 can be formed more easily than patterning of the hard mask 33. That is, the second embodiment can make the manufacturing process easier than that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element manufacturing method comprising:
   sequentially forming a first ferromagnetic layer, a tunnel barrier layer, and a second ferromagnetic layer on a substrate;
   forming a conductive hard mask on the second ferromagnetic layer;
   patterning the hard mask;
   forming a hard layer on a side surface of the hard mask; and
   processing the second ferromagnetic layer, the tunnel barrier layer, and the first ferromagnetic layer by IBE in an oblique direction by using the hard mask and the hard layer as masks,
   wherein the hard layer has an IBE etching rate lower than that of the hard mask.

2. The method of claim 1, wherein a Vickers hardness of the hard layer is higher than that of the hard mask.

3. The method of claim 1, wherein the hard layer comprises one of DLC, $Al_2O_3$, BN, and SiC.

4. The method of claim 1, wherein the hard mask comprises one of TiN, Ta, and W.

5. The method of claim 1, wherein the hard layer and the hard mask comprise the same material, and a density of the hard layer is higher than that of the hard mask.

6. The method of claim 5, wherein the hard layer and the hard mask comprise one of TiN, Ta, and W.

7. The method of claim 1, wherein the forming the hard layer on the side surface of the hard mask comprises:
   forming the hard layer on an entire surface; and
   removing the hard layer from an upper surface of the second ferromagnetic layer and an upper surface of the hard mask by RIE.

8. The method of claim 7, wherein the hard layer comprises DLC, and RIE of the hard layer uses an $O_2$-based gas.

9. The method of claim 7, wherein the hard layer comprises $Al_2O_3$, and RIE of the hard layer uses a $BCl_3$-based gas.

* * * * *